(12) United States Patent
Watanabe (10) Patent No.: US 6,863,553 B2
(45) Date of Patent: Mar. 8, 2005

(54) SOCKET FOR ELECTRICAL PARTS

(75) Inventor: Tsuyoshi Watanabe, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 10/228,991

(22) Filed: Aug. 28, 2002

(65) Prior Publication Data

US 2003/0045148 A1 Mar. 6, 2003

(30) Foreign Application Priority Data

Aug. 31, 2001 (JP) ........................................ 2001-265000

(51) Int. Cl.[7] ............................................. H01R 13/62
(52) U.S. Cl. ...................................... 439/330; 439/331
(58) Field of Search .............................. 439/66, 67, 68, 439/69, 70, 71, 72, 73, 266, 330, 331

(56) References Cited

U.S. PATENT DOCUMENTS

| | | | | | |
|---|---|---|---|---|---|
| 5,320,550 A | * | 6/1994 | Uratsuji et al. | ............. | 439/266 |
| 5,409,392 A | * | 4/1995 | Marks et al. | ............... | 439/266 |
| 5,531,608 A | * | 7/1996 | Abe | ........................... | 439/330 |
| 5,865,639 A | * | 2/1999 | Fuchigami et al. | ......... | 439/330 |
| 6,193,525 B1 | * | 2/2001 | Takayama | ..................... | 439/71 |
| 6,280,219 B1 | * | 8/2001 | Sano et al. | ................. | 439/268 |
| 6,283,780 B1 | * | 9/2001 | Yamamoto et al. | ......... | 439/266 |
| 6,322,384 B1 | * | 11/2001 | Ikeya | ......................... | 439/331 |
| 6,375,484 B1 | * | 4/2002 | Shimada | .................... | 439/330 |

* cited by examiner

Primary Examiner—Thanh-Tam Le
(74) Attorney, Agent, or Firm—Staas & Halsey LLP (57) ABSTRACT

A socket for electrical parts includes: a socket body on which the electrical part having a plurality of terminals is accommodated; a plurality of contact pins arranged to the socket body and adapted to electrically contact with the terminals of the electrical part; and a latch member attached to the socket body and adapted to press the electrical part, the latch member including an arm member attached to be movable to the socket body and a pressing member attached to be movable to the arm member and adapted to press the electrical part, the pressing member being made retractable into a retraction position from a pressing position where the pressing member presses said electrical part, by moving said arm member and said pressing member in relation to said arm member, said electrical part being able to be accommodated on or taken out from the socket body at a time the pressing member is in the retraction position.

16 Claims, 13 Drawing Sheets

PRIOR ART

SOCKET FOR ELECTRICAL PARTS

BACKGROUND OF THE INVENTION

1. Field of the Invention

The present invention relates to a socket for an electrical part for detachably accommodating an electrical part such as a semiconductor device (hereinafter referred to "IC package"), and more particularly, a socket for an electrical part having a latch member to hold down (to press) the electrical part accommodated on the socket.

2. Description of the Related Art

Figure 15:
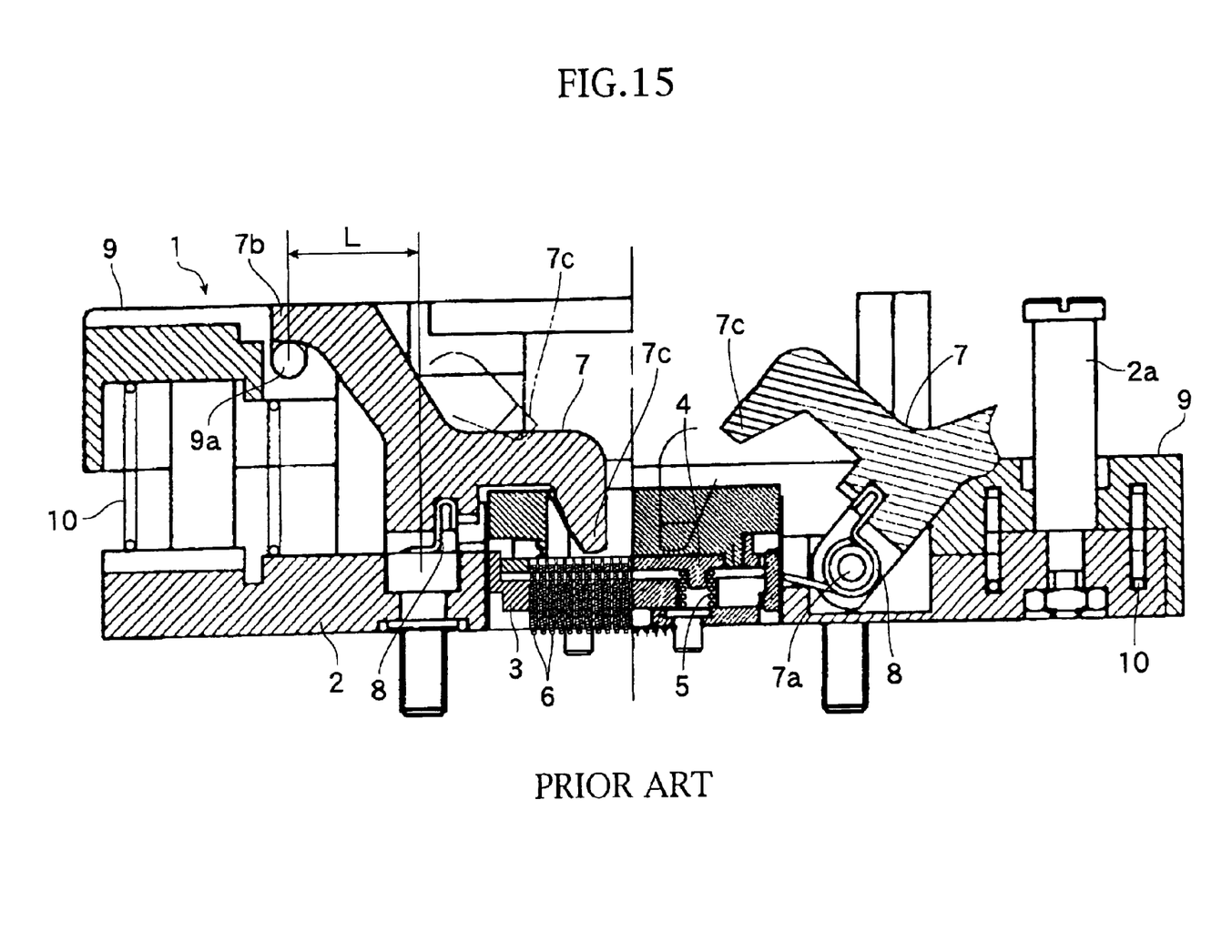
FIG. 15 is a sectional view of an IC socket in accordance with conventional art.
Figure 16:
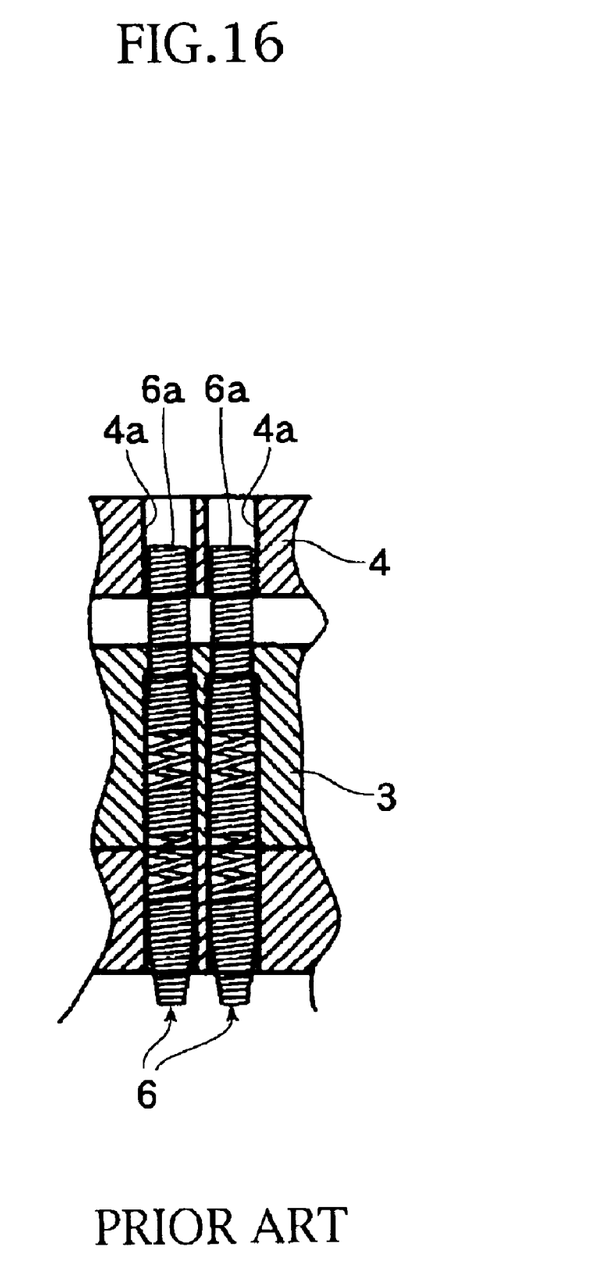
FIG. 16 is an enlarged view of a portion of FIG. 15 where contact pins are arranged.

As shown in FIGS. 15 and 16, a conventional IC socket 1 is known as a "socket for electrical parts" of this kind, which can accommodate IC package (not shown) as an "electrical part."

The IC socket 1 comprises a socket body 2 having a base portion 3; a floating plate 4 disposed on a base portion 3 and urged upward by a spring 5, a floating plate 4 being vertically movable; and a plurality of spring-like contact pins 6 provided for the base portion 3 in a matrix-like arrangement, an upper end portion 6a of a contact pin 6 being inserted into a through hole 4a of the floating plate 4.

Oppositely provided at a right and left portion of the socket body 2 are a pair of latch members 7, which are each attached rotatably to the socket body 2 through rotational shafts 7a. The latch member 7 is urged by a torsional coil spring 8 toward an opening direction thereof.

In addition, on the socket body 2, an operation member 9 is provided and guided vertically by a guide pin 2a. The operation member 9 is urged upwardly by a coil spring 10.

Furthermore, the latch member 7 is engaged with an engaging shaft 9a provided on the operation member 9. The engaging shaft 9a is structured to rotationally move the latch member 7 in a closing direction thereof against an urging force of the torsional coil spring 8, when the operation member 9 is moved upwardly.

In such a socket mentioned above, when the operation member 9 is moved downwardly, the latch member 7 is rotationally moved to open by the urging force of the torsional coil spring 8 and then the IC package is accommodated on the floating plate 4. Then, with the operation member being moved upwardly, a rear end portion 7b of the latch member 7 is pushed up by the engaging shaft 9a of the operation member 9. And at the same time, a front end portion 7c of the latch member 7 pushes an upper surface of the IC package, thereby electrically connecting each of a plurality of terminals provided on a lower surface of the IC package with each of the contact pins 6.

However, in such a conventional socket mentioned above, the latch member 7 must be retracted from a region into which the IC package is inserted, in order to accommodate the IC package. Therefore, there have been a problem that it is necessary to secure a space for rotational movement of the latch member 7 and also to make the amount of vertical movement of the operation member 9 larger because the amount of the rotational movement of the latch member 7 must be made larger.

Furthermore, the front end portion 7c of the latch member 7 presses the IC package by making use of the "principle of leverage," that is, by pressing the rear end portion 7b of the latch member 7 with the engaging shaft 9a of the operation member 9, therefore the distance L between a center of rotation of the latch member 7 and the rear end portion 7b becomes longer consequently, resulting in making the entire size of the IC socket 1 larger, being inconvenient.

SUMMARY OF THE INVENTION

Therefore, an object of the present invention is to provide a socket for electrical parts enabling space for providing a latch member to be small, and consequently enabling the socket for electrical parts to become smaller in size.

In order to achieve the above mentioned object, a first aspect of the present invention is characterized in that a socket for an electrical part, which includes:

a socket body on which the electrical part having a plurality of terminals is accommodated;

a plurality of contact pins provided for the socket body and adapted to electrically contact with the terminals of the electrical part; and a latch member attached to the socket body and adapted to press the electrical part, the latch member including;

an arm member attached to be movable to the socket body; and a pressing member attached to be movable to the arm member and adapted to press the electrical part, the pressing member being made retractable into a retraction position from a pressing position where the pressing member presses the electrical part, by moving the arm member and by moving the pressing member in relation to the arm member, the electrical part being able to be accommodated on or taken out from the socket body at a time the pressing member is in the retraction position.

Another aspect of the present invention is characterized in that the arm member is attached to be rotatable the socket body and the pressing member is attached to be rotatable to the arm member, the pressing member being made retractable into the retraction position by rotationally moving the arm member and by rotationally moving the pressing member.

A still another aspect of the present invention is characterized in that the pressing member is structured to be retracted into the retraction position by rotationally moving the pressing member in a direction opposite to the rotational direction of the arm member.

Another aspect of the present invention is characterized in that an operation member is disposed to be vertically movable on the socket body, the latch member and the pressing member being pushed by the operation member at a time the operation member is moved downwardly, to thereby make the arm member and the pressing member rotationally move.

Another aspect of the present invention is characterized in that the latch member is a pair of latch members oppositely arranged with each other on the socket body, a tension spring member being disposed between and connected with each of the arm member of both of the latch members, each of the arm members being urged each other toward each of the pressing positions.

According to a foregoing aspect of the present invention, since the pressing member is structured to be retracted into the retraction position from the pressing position when the arm member is moved and the pressing member is also moved in relation to the arm member, the latch member's moving distance which is necessary for the pressing member to be retracted into the retraction position from the pressing position can be made shorter, being able to reduce the size of the socket.

According to another aspect of the present invention, the arm member is attached to be rotatable to the socket body and the pressing member is attached to be rotatable to the arm member. And the pressing member is structured to be retracted into the retraction position from the pressing position when the arm member is rotationally moved and the pressing member is also rotationally moved. Therefore, the pressing member can be retracted smoothly into the retraction position with simple mechanical structure.

According to a still another aspect of the present invention, the pressing member is rotationally moved in a direction opposite to the rotational direction of the arm member. And the pressing member is structured to be retracted into the retraction position from the pressing position. Therefore, the latch member's moving distance necessary for the pressing member to be retracted into the retraction position can be made much shorter.

According to another aspect of the present invention, the operation member is disposed on the socket body to be vertically movable. The operation member is structured to push the arm member and the pressing member and to thereby make said arm member and said pressing member rotationally move when the operation member is moved downwardly, so that the latch member can be retracted into the retraction position through an easy and simple operation.

According to another aspect of the present invention, the latch member is a pair of latch members oppositely arranged with each other on the socket body and the tension spring member is disposed between and connected with each arm member of both of the latch members. Both of the arm members are urged each other in a direction the arm members are closing toward the pressing position, so that there is no need to ensure as much lateral dimension as that of prior art, being able to reduce the dimension in width direction of the socket when compared with a conventional one.

Furthermore, since the tension spring member directly pulls the arm member, mechanical force can act more efficiently when compared with the conventional socket in which the latch member is rotationally moved by way of the operation member, being able to ensure pressing force to be sufficiently applied on the electrical part even if a spring weaker in elasticity is used.

Other aspects and features of the present invention will become apparent to those ordinary skilled in the art upon review of the following description of specific embodiments of the present invention in conjunction with the accompanying figures.

BRIEF DESCRIPTION OF THE DRAWINGS

Preferred embodiments of the present invention will now be described with reference to the attached drawings in which:

FIG. 10A, FIG. 10B and FIG. 10C are sectional views showing operations of the latch member of the IC socket of FIG. 1.

FIG. 11A and FIG. 11B are views of an IC package.

FIG. 12A, FIG. 12B and FIG. 12C are sectional views showing operations of a latch member in accordance with a second embodiment of the present invention.

FIG. 13A, FIG. 13B and FIG. 13C are sectional views showing operations of a latch member in accordance with a third embodiment of the present invention.

FIG. 14A, FIG. 14B and FIG. 14C are sectional views showing operations of a latch member in accordance with a fourth embodiment of the present invention.

DESCRIPTION OF THE PREFERRED EMBODIMENTS

Preferred embodiments of the present invention and modifications thereof will be described hereunder with reference to the accompanying drawings.

FIG. 1 to FIG. 11B are views showing an IC socket according to a first embodiment of the present invention.

Figure 1:
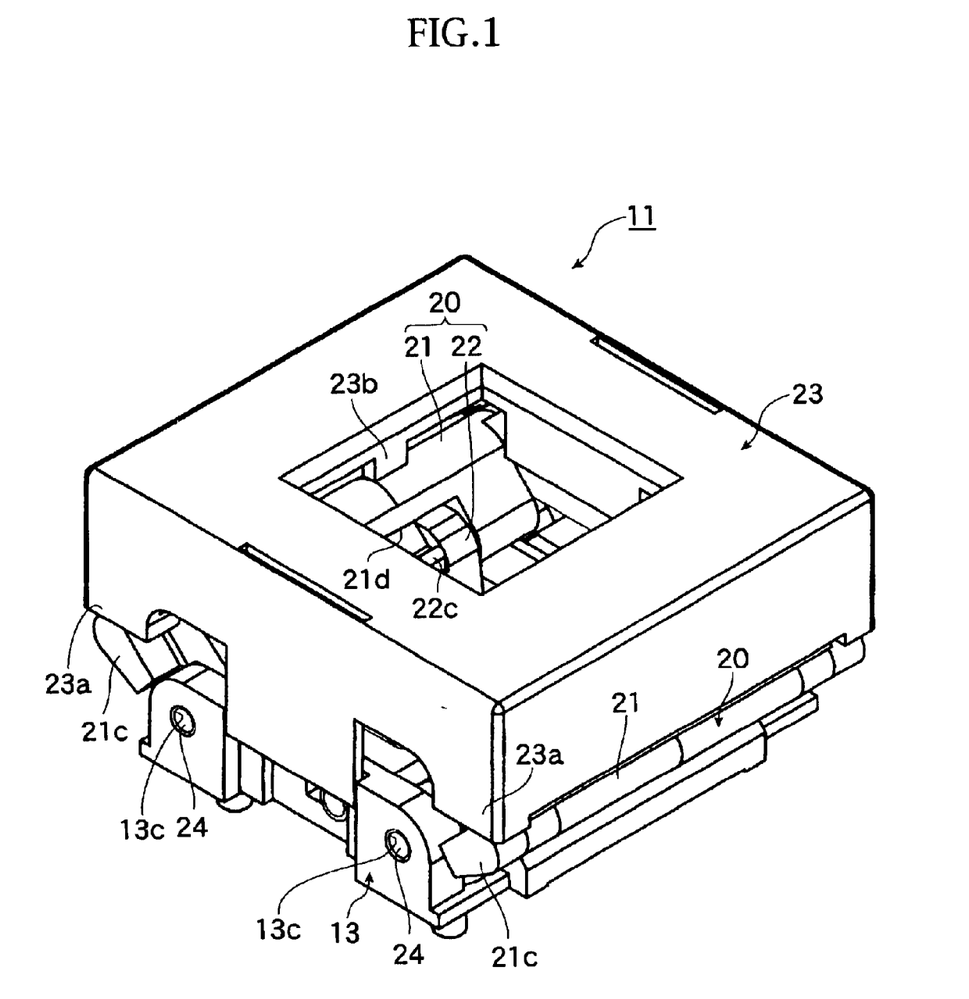
FIG. 1 is a perspective view of an IC socket in accordance with a first embodiment of the present invention.

In FIG. 1, reference numeral 11 denotes an IC socket as a "socket for electrical parts." The IC socket 11 is a socket for carrying out performance testing of an IC package 12 as an "electrical part" and is designed to establish an electrical connection between a terminal of the IC package 12 and a printed wiring board of a tester (not shown in Figs).

Figure 11A:
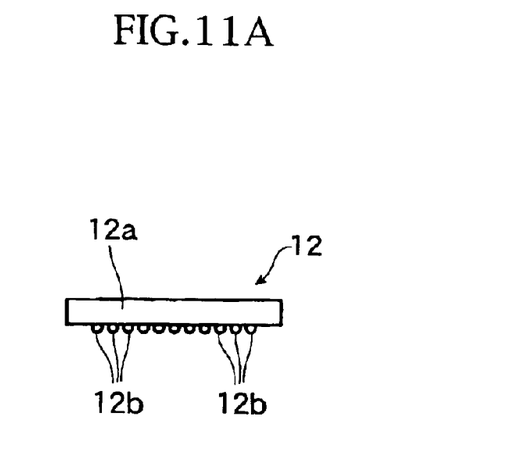
FIG. 11A is a front view of the IC package.
Figure 11B:
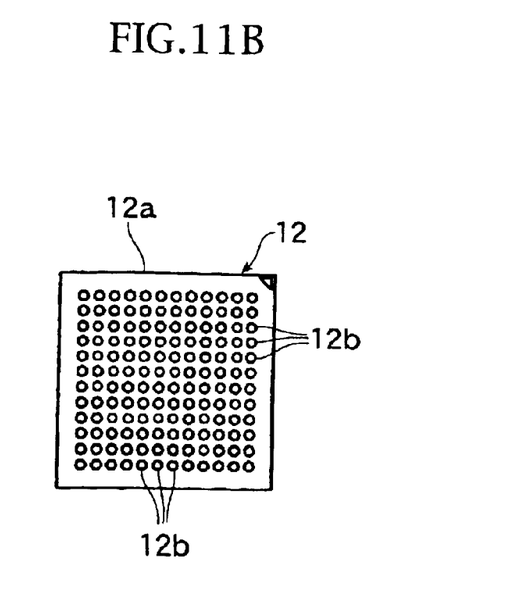
FIG. 11B is a bottom plan view of the IC package.

An example of the IC packages is illustrated in FIG. 11A and FIG. 11B. The example is an IC package, what is called an BGA (Ball Grid Array) type, having for example a rectangular package body 12a and a number of solder balls 12b arranged on a lower surface portion of the package body so as to project downwardly in a matrix-like arrangement.

Figure 3:
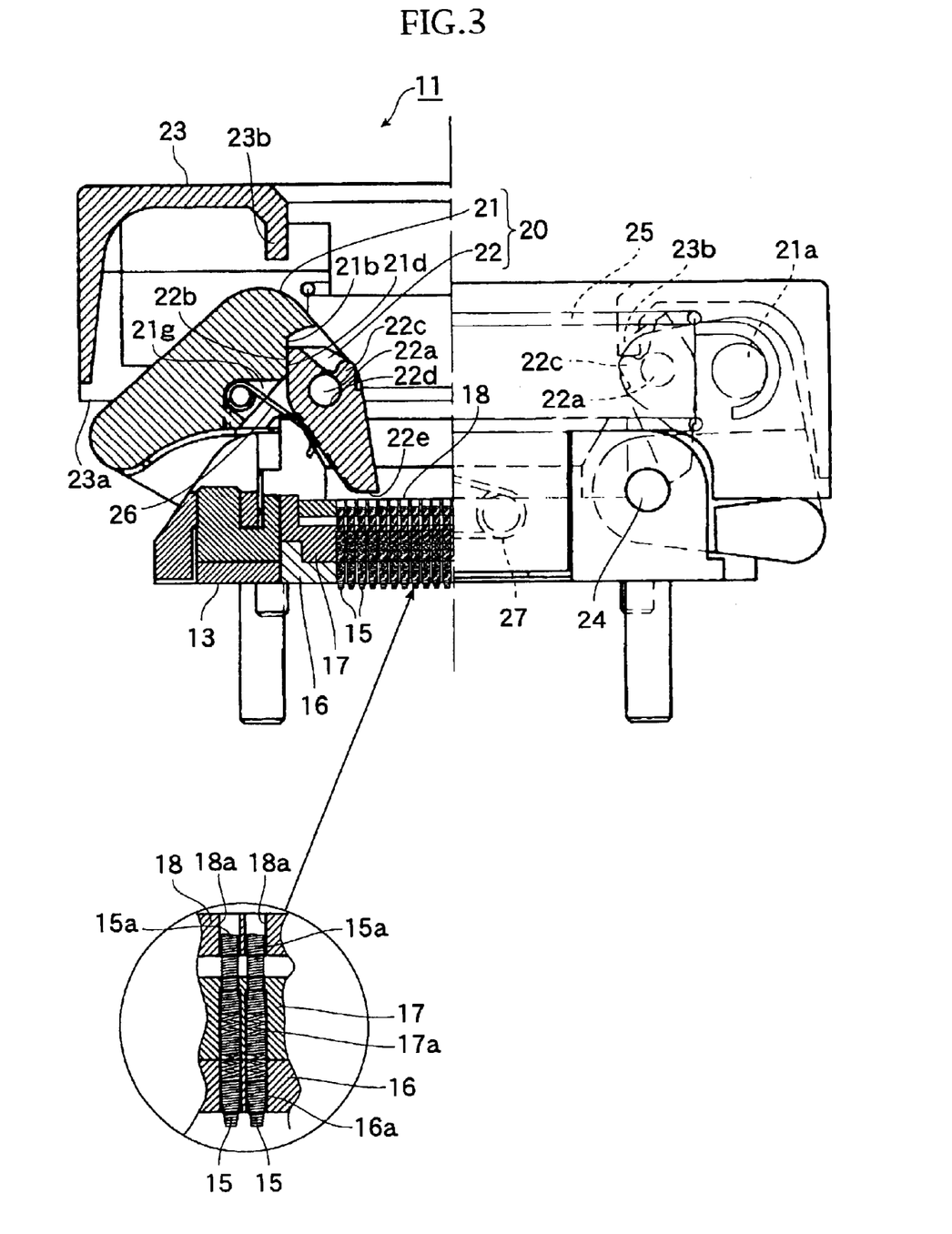
FIG. 3 is a sectional view of the IC socket of FIG. 1 taken along line III—III of FIG. 2.

On the other hand, an example of the IC sockets is outlined as shown in FIG. 3. The IC socket 11 comprises a socket body 13 on which a first base plate 16 and a second base plate 17 are mounted, and a floating plate 18 disposed vertically movable on an upper side of the second base plate 17 and urged upwardly by a spring 19.

The first and the second base plates 16, 17 have throughholes 16a, 17a respectively. Into the throughholes 16a, 17a, a spring like contact pin 15 is inserted, so as to a number of contact pins 15 are arranged in a matrix like manner. And upper side portions of upper end portions 15a of these contact pins 15 are inserted into throughholes 18a of the floating plate 18, respectively.

Figure 4:
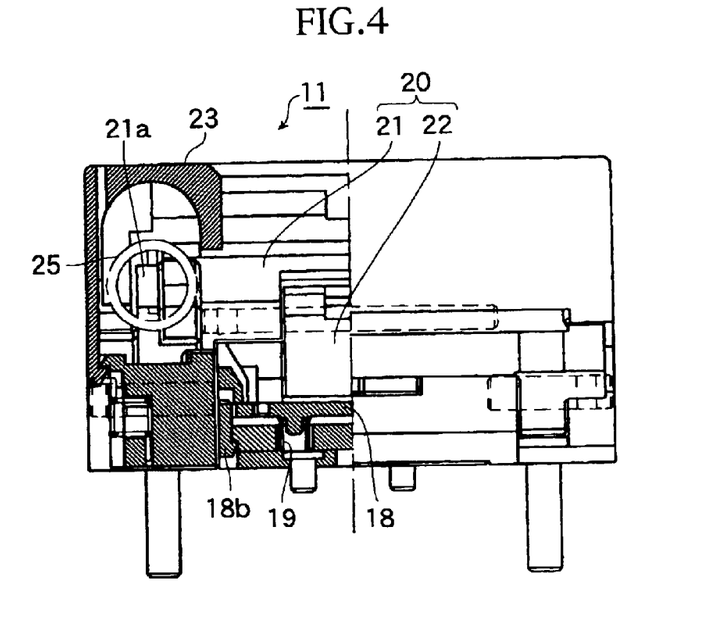
FIG. 4 is a sectional view of the IC socket of FIG. 1 taken along line IV—IV of FIG. 2.

The floating plate 18 is an approximately square like board. As shown in FIG. 4 an engaging claw 18b is extended downwardly from a peripheral portion of the floating plate and engages with the second base plate 17 when the floating plate 18 is at an uppermost position, to restrict a further upward movement of the floating plate.

On the socket body 13, as shown in FIG. 1 to FIG. 4, a pair of latch members 20 are oppositely provided each on the opposite side portion of the socket body 13 so as to be movable between a pressing position where the IC package 12 is pressed and a retraction position under the situation of which the IC package 12 can be accommodated on and taken out from the socket body 13. And an operation member 23 which makes the pair of latch members move, is provided on the socket body 13 to be vertically movable in relation to the socket body 13.

The latch members 20 each comprise an arm member 21 attached movably (rotatably movable) to the socket body 13 and a pressing member 22, for pressing the IC package, attached to the arm member 21 to be rotatably movable.

Figure 5:
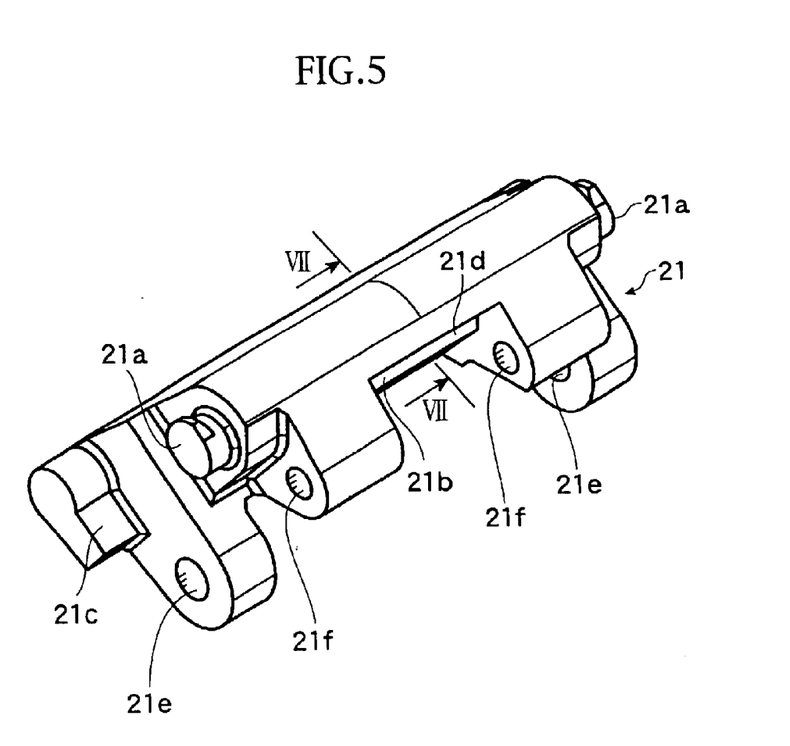
FIG. 5 is a perspective view, viewed from obliquely upper place, of an arm member of a latch member of the IC socket of FIG. 1.
Figure 6:
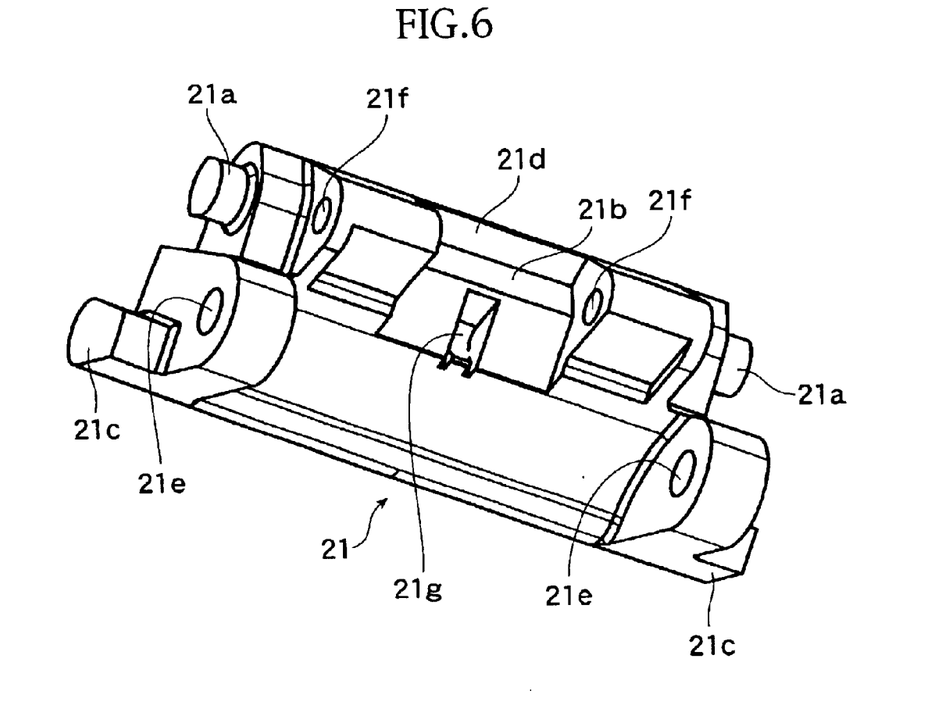
FIG. 6 is a perspective view, viewed from obliquely lower place, of the arm member of the latch member of the IC socket of FIG. 1.
Figure 7:
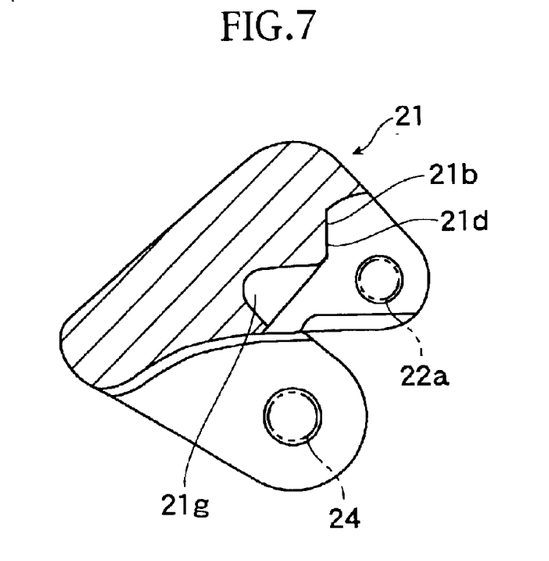
FIG. 7 is a sectional view of the IC socket of FIG. 1 taken along line VII—VII of FIG. 5.

The arm members 21, as shown in FIG. 5 and FIG. 6, are formed to have a length approximately equal to the entire width of the IC socket 11. Inserted into a shaft insertion hole 21e formed to a lower portion of the arm member 21 is a shaft 24. By supporting the shaft 24 with a shaft supporting hole 13c formed to the socket body 13, the arm member 21 can be rotatably movable in relation to the socket body 13 (refer to FIG. 1). In addition, on the side of the arm member 21, an operating protrusion 21c is protrudingly outwardly formed in a lateral direction. When the operating protrusion 21c is pressed by a first pressing portion 23a of the operation member 23, the arm member 21 is rotationally moved in an outward direction (in a direction the latch member 20 is opened) from the socket body 13 (counterclockwise direction in FIG. 10A, FIG. 10B and FIG. 10C).

Moreover, connecting shafts 21a are protrudingly outwardly formed at both side portions in a longitudinal direction of an upper portion of the arm member 21. The connecting shafts 21a of the pair of arm members 21 are linked each other with a tension coil spring 25 as a "tension spring member," so as to urge both arm members 21 toward the inward direction of the socket body 13 or in a direction of both arm members 21 gets close to each other (in a closing direction of the latch member 20) (refer to FIG. 3).

Furthermore, the pressing member 22, as shown in FIG. 3, is arranged rotatably in an arrangement recess portion 21d of the arm member 21 by supporting a supporting shaft 22a inserted into a supporting shaft insertion hole 22d by a supporting hole 21f of the arm member 21. And the pressing member 22 is urged counterclockwise as shown in FIG. 3 by a torsional coil spring 26 seated in a seating recess portion 21g of the arm member 21. When the pressing member 22 is positioned at a place shown in FIG. 3, an abutting surface 22b of the pressing member 22 abuts against a stopper wall 21b of the arm member 21, so as to be structured to prevent the pressing member from further moving in counterclockwise direction from a situation shown in FIG. 3. At this situation, another one of the pair of pressing members 22 hidden in right side in FIG. 3 is prevented from clockwise rotation.

Figure 8:
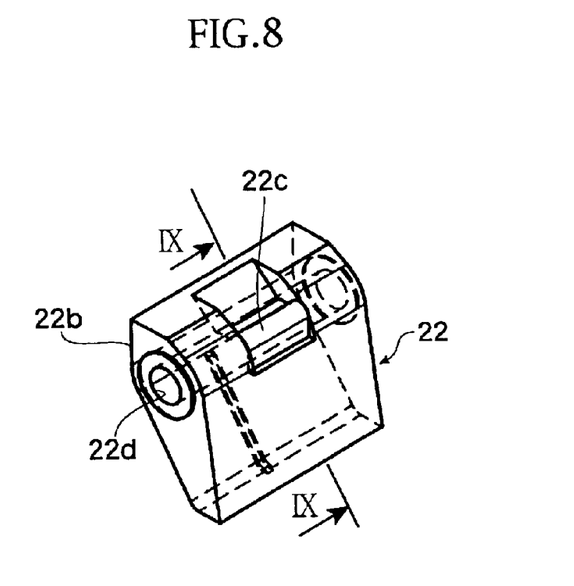
FIG. 8 is a perspective view of a pressing member of the latch member of FIG. 1.
Figure 9:
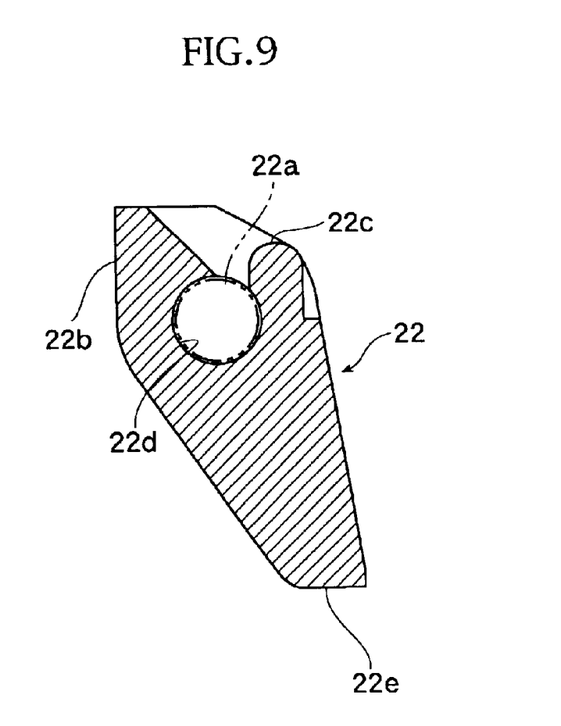
FIG. 9 is an enlarged sectional view of the IC socket of FIG. 1 taken along line IX—IX of FIG. 8.
Figure 10A:
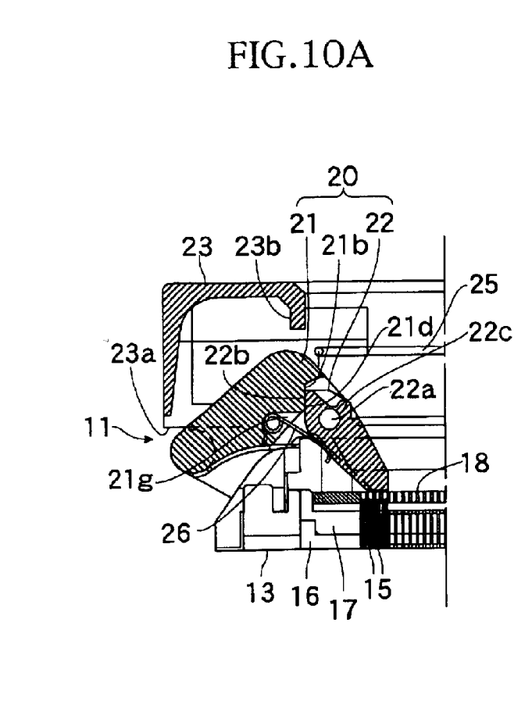
FIG. 10A is a view of a situation where the operation member is in the uppermost position (the latch member is in a pressing position)
Figure 10B:
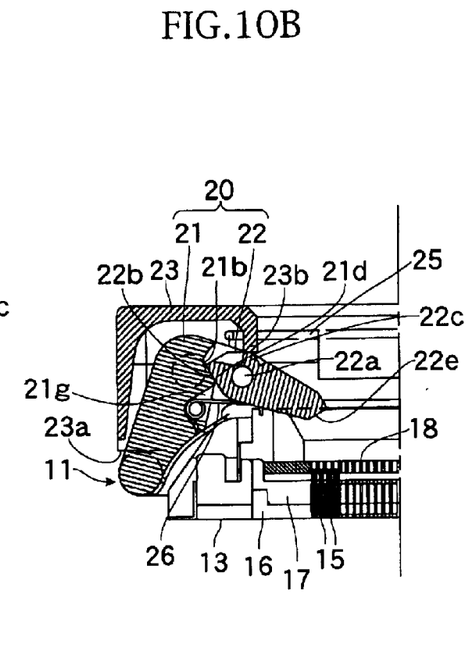
FIG. 10B is a view of a situation where the operation member is in the course of downward movement.
Figure 10C:
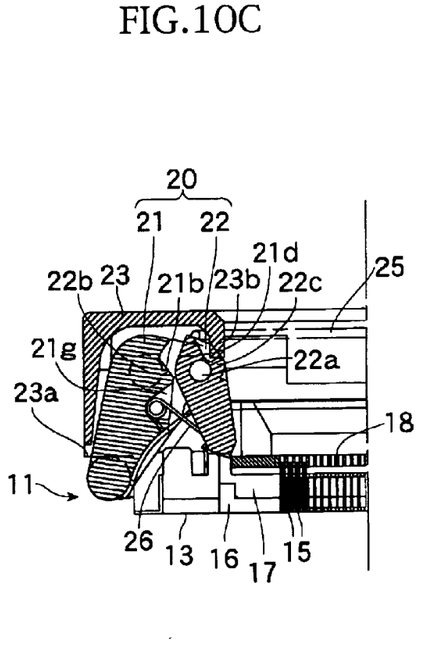
FIG. 10C is a view of a situation where the operation member is in the lowermost position (the latch member is in a retraction position)

Furthermore, on the pressing member 22, as shown in FIG. 8 and FIG. 9, a press projection portion 22c is formed. When the operation member 23 is depressed downwardly, the press projection portion 22c is pressed by a second pressing portion 23b formed on the operation member 23, so that the pressing member 22 is structured to move rotationally clockwise as shown in FIG. 10A, 10B and 10C against the urging force of the torsional coil spring 26.

In addition, the contact pin 15 is made of electrically conductive and coil-likely winded wire as shown in FIG. 3 and is structured to be expandable and contractible in a vertical direction. When the floating plate 18 is depressed against the urging force of the spring 19, its upper end portion 15a is structured to be brought in contact with a solder ball 12b of the IC package 12.

Figure 2:
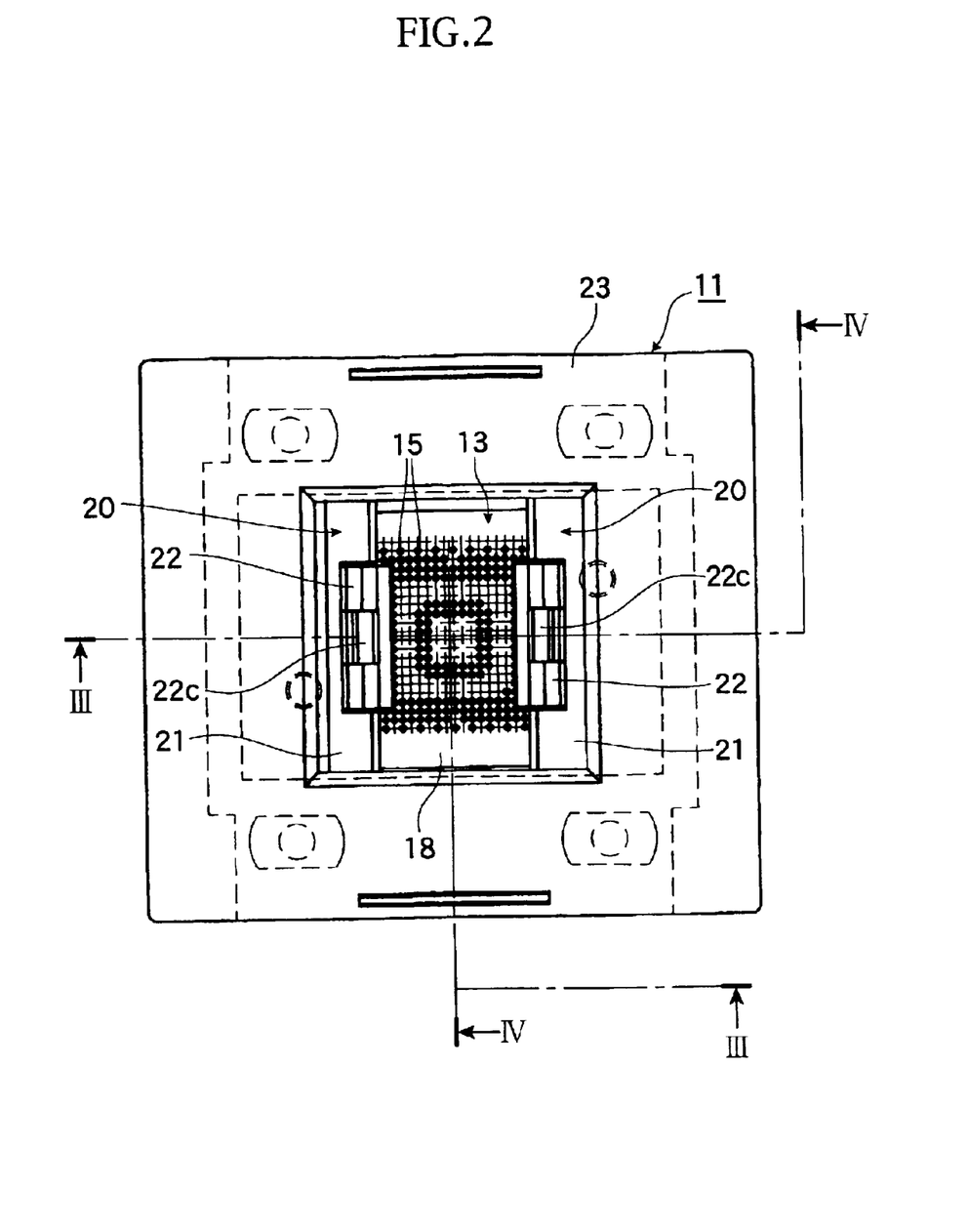
FIG. 2 is a plan view of the IC socket of FIG. 1.

Furthermore, as shown in FIG. 2 which is a plan view, the operation member 23 is formed to be a frame like shape having an opening at its central portion large enough for inserting and taking out the IC package 12, disposed to be vertically movable in relation to the socket body 13, and urged upwardly by the torsional coil spring 27 as shown in FIG. 3.

Next, the function or operation of such an IC socket 11 of the present invention will be explained hereunder.

In order to accommodate the IC package 12 on the floating plate 18, the operation member 23 is depressed. With this operation, the operating protrusion 21c of the arm member 21 is at first pressed by the first pressing portion 23a to rotationally move the arm member 21 toward the outside of the socket body 13 against the urging force of the tension coil spring 25 from a situation shown in FIG. 10A to a situation shown in FIG. 10B.

In addition, with the operation member 23 being depressed, the press projection portion 22c of the pressing member 22 of the latch member 20 is pressed, and as shown in FIG. 10C, the pressing member 22 is rotationally moved in a direction opposite to the rotational movement of the arm member 21 against the urging force of the torsional coil spring 26.

According to the movement mentioned above, as shown in FIG. 10C, the pressing member 22 is retracted into the retraction position from the pressing position.

Under this situation, the IC package 12 is fed and accommodated on the floating plate 18 by for example an automated machinery.

As mentioned above, since the latch member 20 is comprised of two members—the arm member 21 and the pressing member 22—, and the pressing member 22 is structured to be rotationally movable independently in relation to the arm member 21, a space for the rotational movement of the latch member 20 which moves between the pressing position and the retraction position can be made smaller when compared with the conventional latch member 7 composed of one member. In addition, in a case where the arm member 21 and the pressing member 22 are made to move in different rotational direction with each other, the space for the rotational movement can be made much smaller.

Next, in order to bring the socket into a situation where the IC package 12 is pressed with the latch member 20, the operation member 23 is then moved upwardly. During the upward movement of the operation member, the pressing force applied on the press projection portion 22c of the pressing member 22 of the latch member 20 by the second pressing portion 23b of the operation member 23 is released. And then the pressing member 22 is moved counterclockwise as shown in FIG. 10A, 10B and 10C by the urging force of the torsional coil spring 26. And then the abutting surface 22b of the pressing member 22 abuts against the stopper portion 21b of the arm member 21, thereby the rotational movement of the pressing member 22 is made to stop.

When the operation member 23 is further moved upwardly, the pressing force applied on the operating protrusion 21c of the arm member 21 by the first pressing portion 23a of the operation member 23 is released. And then the pair of the arm members 21 is moved rotationally toward the closing direction thereof by the tension coil spring 25.

According to the movement mentioned above, a front end surface of the pressing member 22 abuts against an upper surface of the IC package 12 and presses it by the urging force of the tension coil spring 25.

As mentioned above, since the upper end portion (the connecting shaft 21a) of the arm member 21 is urged inwardly by the tension coil spring 25, there is no need to set up distance L in a crosswise direction (in a right and left direction in FIG. 3 and FIG. 15), thereby enabling the socket to be made smaller in size in its width direction (in a crosswise direction) when compared with the conventional socket shown in FIG. 15.

In addition, since the tension coil spring 25 directly pulls the arm member 21, mechanical force can be used efficiently when compared with a conventional socket in which a latch member is indirectly urged by way of an operation member toward a pressing portion as shown in FIG. 15, being able to ensure pressing force to be applied on the IC package 12 even when a spring weaker in elasticity is used.

In particular, in a socket like this embodiment in which the contact pin 15 and the solder ball 12b of the IC package 12 are brought into contact with each other with a prescribed pressure by pressing the IC package 12 with the latch member 20 and by depressing the floating plate 18 against the urging force of the spring 19, urging force to be applied on the latch member 20 must be made stronger.

Accordingly, the structure of the present invention, in which the tension coil spring 25 is disposed in such a manner as mentioned above, is highly effective especially for an aim of making the urging force acting on the latch member 20 much stronger.

In addition, in the embodiment mentioned above, the arm member 21 and the pressing member 22 are pressed by the operation member 23 which moves vertically. However, in a case where the socket has no operation member, the latch member can be moved rotationally with the latch member being directly pushed by, for example, an automated machinery.

Furthermore, in the embodiment mentioned above, the pressing member 22 is rotationally moved after the arm member 21 is rotationally moved to a prescribed angle. However the present invention is not limited to this embodiment and can be modified to be, for example, a structure in which the arm member 21 and the pressing member 22 are moved approximately simultaneously.

Figure 12A:
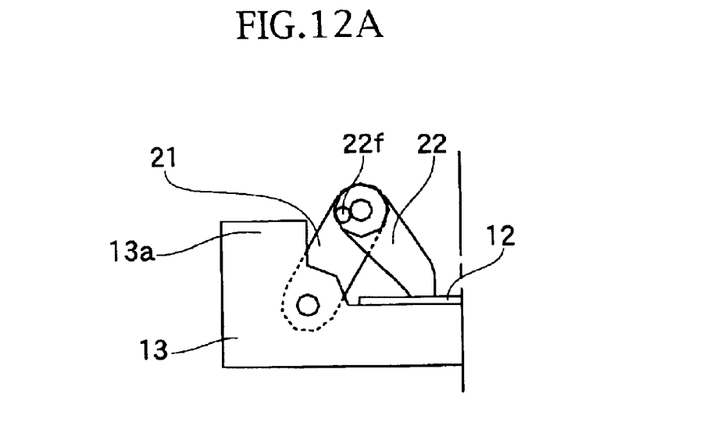
FIG. 12A is a view of a situation where the latch member is in a pressing position.
Figure 12B:
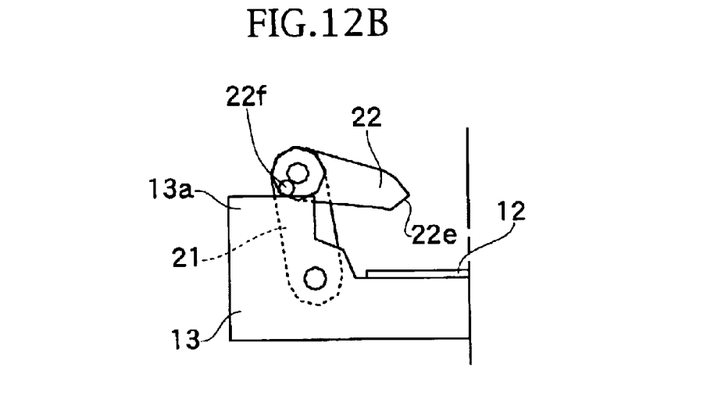
FIG. 12B is a view of a situation where the latch member is in the course of retraction movement.
Figure 12C:
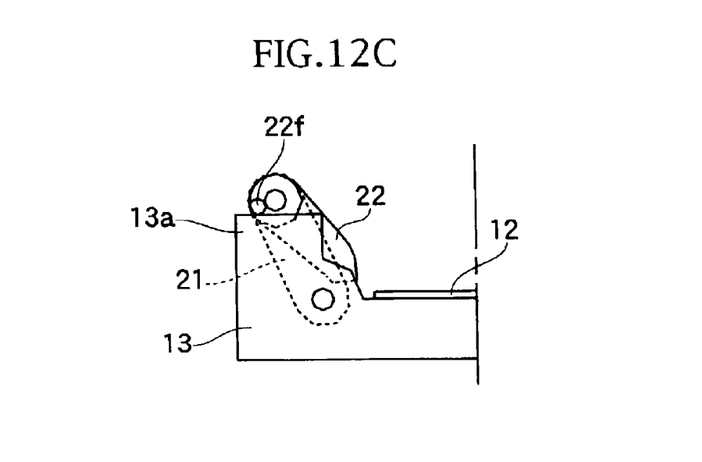
FIG. 12C is a view of a situation where the latch member is in a retraction position.

Furthermore, in the embodiment mentioned above, the pressing member 22 of the latch member 20 is pushed and rotationally moved by the second pressing portion 23b provided for the operation member 23. However, the present invention is not limited to this embodiment and can be modified to be, for example, a structure as shown in from FIG. 12A to FIG. 12C. That is, an engaging projection 22f is formed to the pressing member 22, and an engaging protrusion 13a, which is designed to engage with the engaging projection 22f, is formed to the socket body 13, so that the pressing member 22 can be moved clockwise as shown in FIG. 12A, 12B and 12C after the arm member 21 is outwardly and rotationally moved and the engaging projection 22f abuts against the engaging protrusion 13a. In this embodiment, the pressing member 22 has stopper means (not shown in FIG. 12A, 12B and 12C) to prevent the pressing member 22 from further moving counterclockwise from the situation shown in FIG. 12A.

Figure 13A:
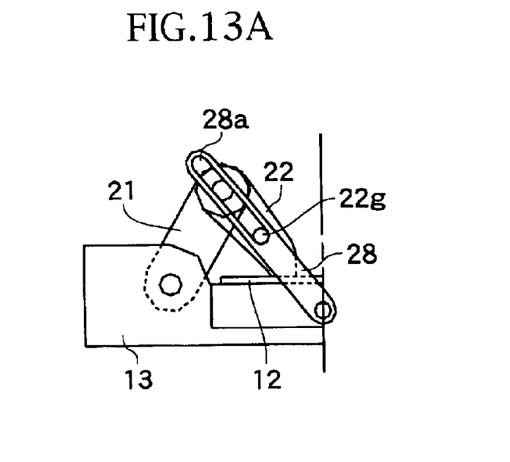
FIG. 13A is a view of a situation where the latch member is in a pressing position.
Figure 13B:
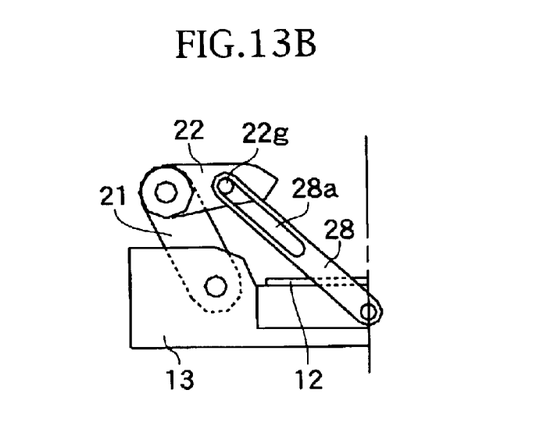
FIG. 13B is a view of a situation where the latch member is in the course of retraction movement.
Figure 13C:
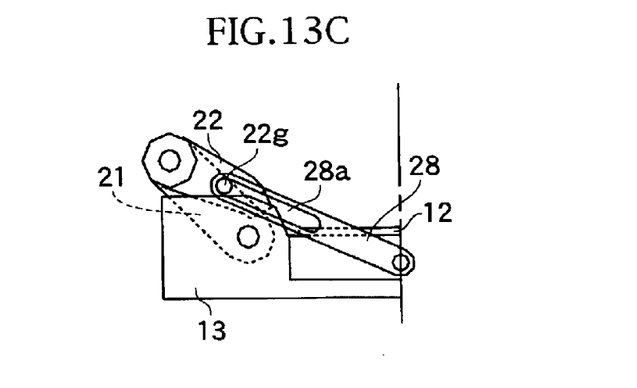
FIG. 13C is a view of a situation where the latch member is in a retraction position.

Furthermore, as shown in FIG. 13A to FIG. 13C, an end portion of a link member 28 having an ellipsoidal hole 28a at another end portion thereof is mounted on the socket body 13 to be rotatably movable, and an engaging projection 22g formed to the operation member 22 is movably engaged with the ellipsoidal hole 28a, so that the pressing member 22 can be moved clockwise as shown in FIG. 13A, 13B and 13C because the engaging projection 22g can move within the ellipsoidal hole 28a of the link member 28 with the arm member 21 moving rotationally outwardly.

Figure 14A:
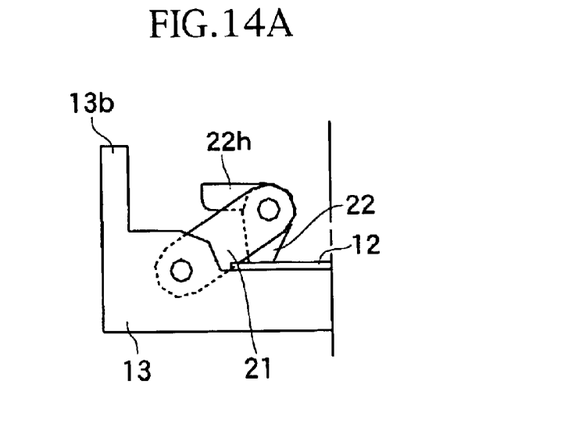
FIG. 14A is a view of a situation where the latch member is a pressing position.
Figure 14B:
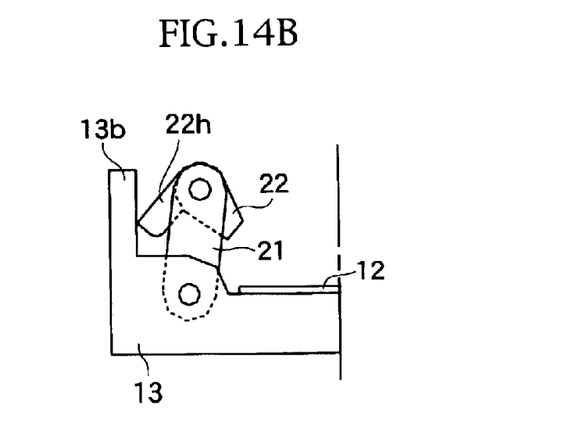
FIG. 14B is a view of a situation where the latch member is in the course of retraction movement.
Figure 14C:
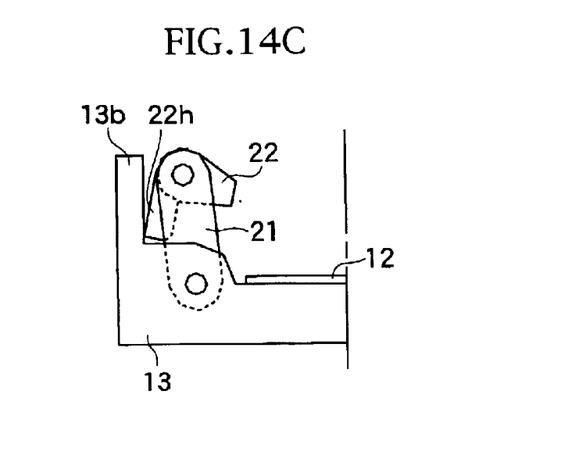
FIG. 14C is a view of a situation where the latch member is in a retraction position.

What is more, in the embodiment mentioned above, the rotational direction of the pressing member 22 is a direction opposite to the rotational direction of the arm member 21. However the present invention is not limited to this embodiment and can be modified to be, for example, a structure as shown in from FIGS. 14A to 14C. That is, an abutting wall portion 13b is formed to a side peripheral portion of the socket body 13 and an abutting means such as an abutting protrusion 22h or the like formed to the pressing member 22 and protruded in a direction of about 90° with respect to a pressed direction (vertical direction in FIG. 14A, 14B and 14C) of the IC package. When the arm member 21 is moved rotationally outwardly, the abutting protrusion 22h is designed to abut against the abutting wall portion 13b, so that a rotational direction of the pressing member 22 can be the same direction (counterclockwise direction) as that of the arm member 21.

In addition, in the embodiment mentioned above, the present invention is directed to a socket on which the IC package 12 having a BGA type is accommodated. However the present invention is not limited to a BGA type IC package and can be also applied to a socket which is designed to accommodate an LGA (Land Grid Array) or a PGA (Pin Grid Array) type both of which have terminals on the lower surface thereof, and a QFP or SOP type both of which have terminals on the lateral side portion. Also any arm member can be used if the arm member can be movable in relation to the socket body. For example an arm member having a movement other than the rotational movement can be also used.

The above description of embodiments should not be interpreted in any limiting manner since variations and refinements can be made without departing from the spirit of the invention. The scope of the invention is defined by the appended claims and their equivalents.

What is claimed is:

1. A socket for an electrical part, comprising:
  a socket body on which the electrical part having a plurality of terminals is accommodated;
  a plurality of contact pins provided for the socket body and adapted to electrically contact with the terminals of the electrical part; and
  a latch member attached to the socket body and adapted to press the electrical part, said latch member comprising:

an arm member attached to be movable to the socket body, and a pressing member attached to the arm member to be rotationally moveable independently of the arm member and adapted to press said electrical part, the pressing member being restricted in rotational movement with respect to the arm member as the pressing member moves to press the electrical part, wherein said pressing member is retractable into a retraction position from a pressing position, in which the pressing member presses said electrical part, by moving said arm member and by rotationally moving said pressing member in relation to said arm member, said electrical part being able to be accommodated on or taken out from the socket body at a time the pressing member is in the retraction position.

2. A socket for an electrical part according to claim 1, wherein said arm member is attached to be rotatable to said socket body and said pressing member is attached to be rotatable to said arm member, said pressing member being made retractable into said retraction position by rotationally moving said arm member and by rotationally moving said pressing member.

3. A socket for an electrical part according to claim 2, wherein said pressing member is structured to be retracted into said retraction position by rotationally moving said pressing member in a first rotational direction opposite to the rotational direction of said arm member.

4. A socket for an electrical part according to claim 2 or 3, wherein an operation member is disposed to be vertically movable on said socket body, said latch member and said pressing member being pushed by the operation member at a time the operation member is moved downwardly, to thereby make said arm member and said pressing member rotationally move.

5. A socket for an electrical part according to claim 1, 2 or 3, wherein said latch member is a pair of latch members oppositely arranged with each other on said socket body, a tension spring member being disposed between and connected with each said arm member of both of the latch members, each of said arm members being urged each other toward each of said pressing positions.

6. A socket for an electrical part according to claim 3, wherein the arm member has a stopper portion and the pressing member has an abutting portion abutting against the stopper portion so as to prevent the pressing member from further moving in a second rotational direction opposite to the rotational direction of said arm member at a time the pressing member is at the pressing position.

7. A socket for an electrical part according to claim 6, wherein the pressing member is urged by a spring in the second rotational direction so as for the abutting portion to abut against the stopper portion.

8. A socket for an electrical part, comprising:
a socket body on which the electrical part having a plurality of terminals is accommodated;
a plurality of contact pins provided for the socket body and adapted to electrically contact with the terminals of the electrical part; and
a latch member attached to the socket body and adapted to press the electrical part, said latch member comprising:
an arm member attached to be movable to the socket body, and
a pressing member attached to be movable to the arm member and adapted to press said electrical part, wherein said pressing member is retractable into a retraction position from a pressing position, in which the pressing member presses said electrical part, by moving said arm member and by moving said pressing member in relation to said arm member, said electrical part being able to be accommodated on or taken out from the socket body at a time the pressing member is in the retraction position;

wherein said latch member is a pair of latch members oppositely arranged with each other on said socket body, a tension spring member being disposed between and connected with each said arm member of both of the latch members, each of said arm members being urged each other toward each of said pressing positions.

9. A socket for an electrical part according to claim 8, wherein said arm member is attached to be rotatable to said socket body and said pressing member is attached to be rotatable to said arm member, said pressing member being made retractable into said retraction position by rotationally moving said arm member and by rotationally moving said pressing member.

10. A socket for an electrical part according to claim 9, wherein said pressing member is structured to be retracted into said retraction position by rotationally moving said pressing member in a rotational direction opposite to the rotational direction of said arm member.

11. A socket for an electrical part, comprising:
a socket body on which the electrical part having a plurality of terminals is accommodated;
a plurality of contact pins provided for the socket body and adapted to electrically contact with the terminals of the electrical part; and
a latch member attached to the socket body and adapted to press the electrical part, said latch member comprising:
an arm member attached to be movable to the socket body, and
a pressing member attached to the arm member to be rotationally movable independently of the arm member and adapted to press said electrical part, wherein said pressing member is retractable into a retraction position from a pressing position, in which the pressing member presses said electrical part, by moving said arm member and by rotationally moving said pressing member in relation to said arm member, said electrical part being able to be accommodated on or taken out from the socket body at a time the pressing member is in the retraction position;

wherein said arm member is attached to be rotatable to said socket body and said pressing member is attached to be rotatable to said arm member, said pressing member being made retractable into said retraction position by rotationally moving said arm member and by rotationally moving said pressing member;

wherein said pressing member is structured to be retracted into said retraction position by rotationally moving said pressing member in a first rotational direction opposite to the rotational direction of said arm member; and wherein the arm member has a stopper portion and the pressing member has an abutting portion abutting against the stopper portion so as to prevent the pressing member from further moving in a second rotational direction opposite to the rotational direction of said arm member at a time the pressing member is at the pressing position.

12. A socket for an electrical part according to claim 11, wherein the pressing member is urged by a spring in the second rotational direction so as for the abutting portion to abut against the stopper portion.

13. A latch member to press an electrical part in a socket body, the latch member comprising:

an arm member attached to be movable to the socket body; and a pressing member attached to the arm member to be rotationally movable independently of the arm member and adapted to press said electrical part;

wherein said pressing member is retractable into a retraction position from a pressing position, in which the pressing member presses said electrical part, by moving said arm member and by rotationally moving said pressing member in relation to said arm member, said electrical part being able to be accommodated on or taken out from the socket body at a time the pressing member is in the retraction position; and the pressing member is restricted in movement with respect to the arm member as the pressing member moves to press the electrical part.

14. A socket for an electrical part, comprising:

a socket body on which the electrical part having a plurality of terminals is accommodated;

a plurality of contact pins provided for the socket body and adapted to electrically contact with the terminals of the electrical part; and a latch member attached to the socket body and adapted to press the electrical part, said latch member comprising:

an arm member attached to be movable to the socket body, and a pressing member attached to be movable to the arm member and adapted to press said electrical part, the pressing member being restricted in movement with respect to the arm member as the pressing member moves to press the electrical part, wherein said pressing member is retractable into a retraction position from a pressing position, in which the pressing member presses said electrical part, by moving said arm member and by moving said pressing member in relation to said arm member, said electrical part being able to be accommodated on or taken out from the socket body at a time the pressing member is in the retraction position, and wherein said latch member is a pair of latch members oppositely arranged with each other on said socket body, a tension spring member being disposed between and connected with each said arm member of both of the latch members, each of said arm members being urged each other toward each of said pressing positions.

15. A socket for an electrical part according to claim 14, wherein said arm member is attached to be rotatable to said socket body and said pressing member is attached to be rotatable to said arm member, said pressing member being made retractable into said retraction position by rotationally moving said arm member and by rotationally moving said pressing member.

16. A socket for an electrical part according to claim 15, wherein said pressing member is structured to be retracted into said retraction position by rotationally moving said pressing member in a rotational direction opposite to the rotational direction of said arm member.

* * * * *